United States Patent
Spriester et al.

[19]

[11] Patent Number: 5,850,165
[45] Date of Patent: *Dec. 15, 1998

[54] NON-INTERRUPTABLE TAP AND METHOD

[75] Inventors: Bart Spriester, Norcross; James L. Dale, Lawrenceville, both of Ga.

[73] Assignee: Scientific-Atlanta, Inc., Norcross, Ga.

[ * ] Notice: The term of this patent shall not extend beyond the expiration date of Pat. No. 5,648,745.

[21] Appl. No.: 893,916

[22] Filed: Jul. 11, 1997

Related U.S. Application Data

[63] Continuation of Ser. No. 408,605, Mar. 21, 1995, Pat. No. 5,648,745.

[51] Int. Cl.⁶ .................................................. H03H 7/00
[52] U.S. Cl. ............................................ 333/100; 333/136
[58] Field of Search ................................. 333/100, 101, 333/105, 127, 136, 24 R; 439/76.1, 189; 455/3.1, 132; 200/51.1

[56] References Cited

U.S. PATENT DOCUMENTS

| | | | |
|---|---|---|---|
| 3,881,160 | 4/1975 | Ross | 333/127 X |
| 3,895,318 | 7/1975 | Ross | 200/51.1 X |
| 4,825,021 | 4/1989 | Pauza | 200/51.1 X |

*Primary Examiner*—Paul Gensler
*Attorney, Agent, or Firm*—Kelly A. Gardner; Kenneth M. Massaroni; Hubert J. Barnhardt, III

[57] ABSTRACT

A method and system for distributing multimedia signals to a subscriber from a headend unit. The multimedia signals are transmitted on a network media as an RF signal. The RF signal is fed to an input terminal of a tap which has an RF circuit that splits the RF signal and distributes to an output terminal. The RF circuit splits the RF signals, and feeds the split signal to a plurality of connectors on the tap's front panel. The RF signals on the output terminal are fed downstream to a plurality of subscribers. A plate is placed in the tap such that when the RF circuit is removed for repair, maintenance or service, an electrical connection is maintained between the input and output terminal to prevent a disconnection of service downstream.

8 Claims, 4 Drawing Sheets

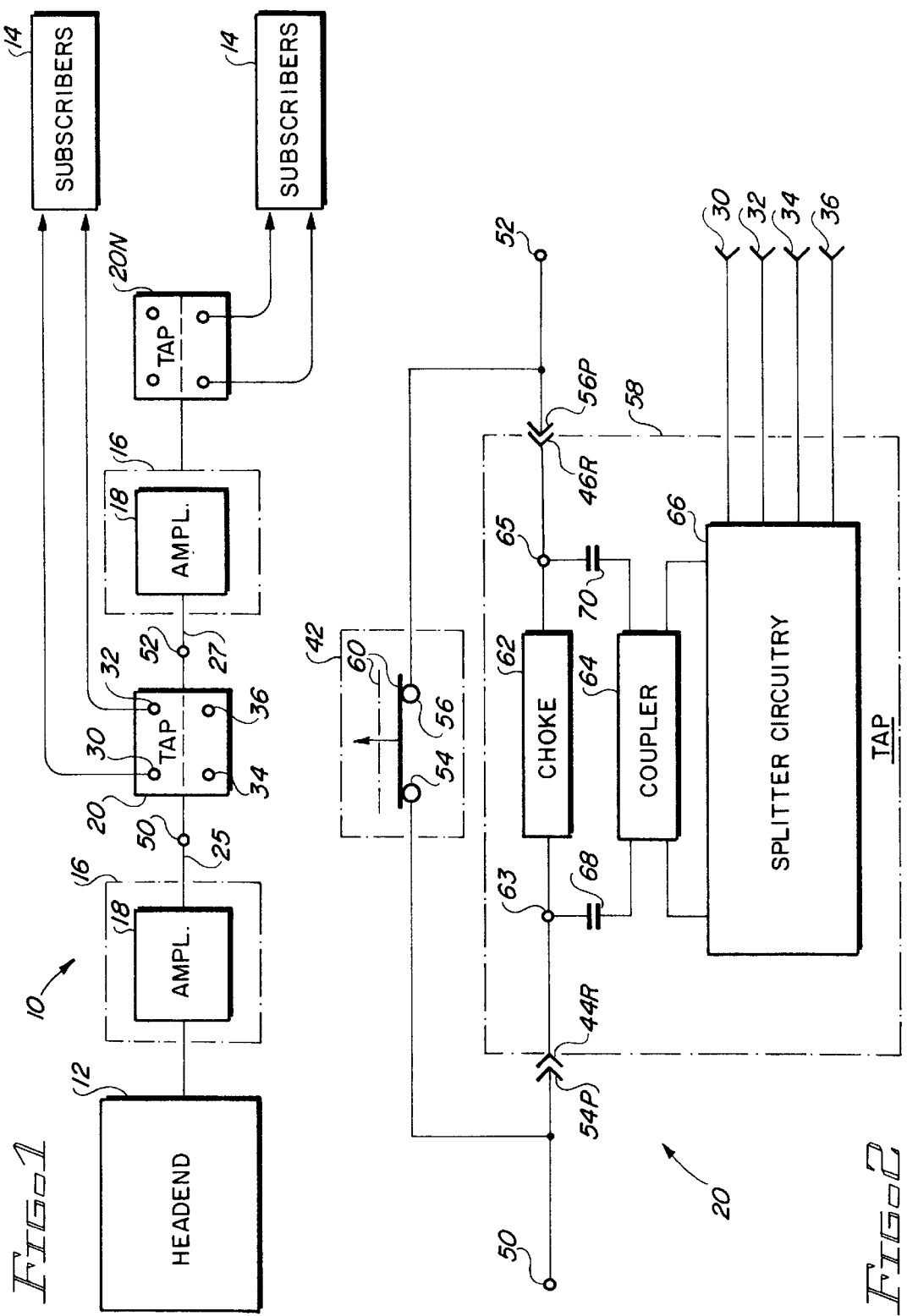

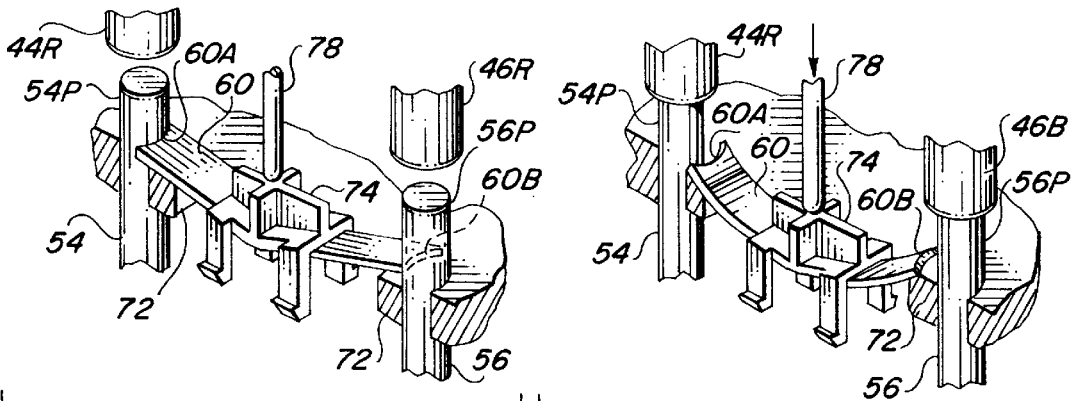
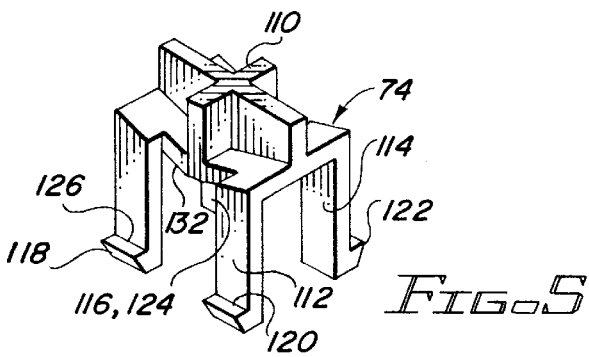
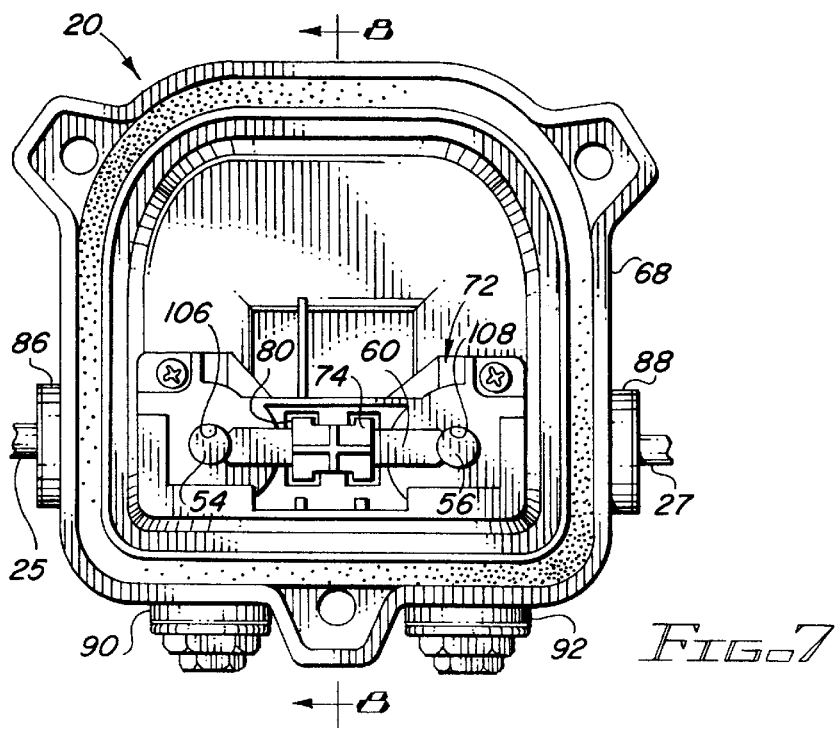

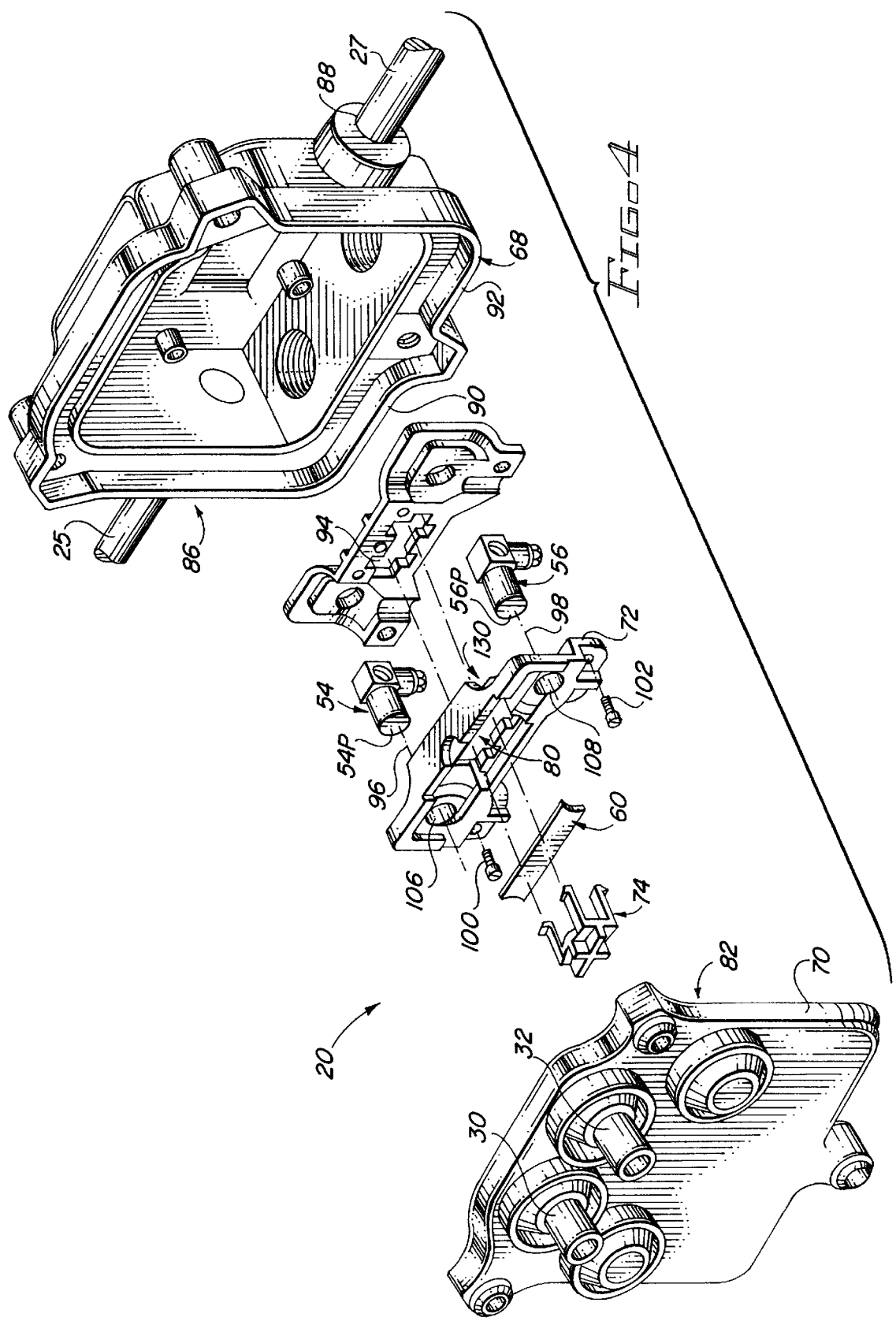

NON-INTERRUPTABLE TAP AND METHOD

This application is a continuation of U.S. patent application Ser. No. 08/408,605 filed Mar. 21, 1995, U.S. Pat. No. 5,648,745.

BACKGROUND OF THE INVENTION

This invention relates to a method and apparatus for distributing broadband signals to a subscriber, more particularly the invention relates to a tap that splits RF signals, and then distributes these split signals to the home, and specifically the invention relates to a tap that can be maintained without interrupting downstream service.

When distributing radio frequency (RF) signals, such as video signals, over cable, it is common practice to transmit RF signals over a coaxial cable through an amplifier to a plurality of passive devices. These RF signals originate from a central location commonly referred to as the "headend". Passives tap off the RF signal from the cable distribution system and feed the tapped off RF signal to various subscriber equipment. With the advent of interactive television, these passives must also pass RF signals from the home to the headend (upstream) without interfering with RF signals sent to other passives and amplifiers (downstream). The passive equipment, however, must also pass and distribute the RF signal downstream without interfering with the various operations that relate to the RF signals.

In today's distribution network, certain other equipment such as network interface units (NIU's ) and customer interface units (CIU's ) are coupled to the home to provide subscriber services to the subscriber such as voice (i.e. telephony), video, data (i.e. modem and facsimile transmissions). The NIU and CIU do need the single AC power signal and a separate RF signal from the passives for its operation. The NIU and CIU because they supply telephony, must supply signals to the home in case of a power failure. Therefore, the NIU and CIU must receive non-interruptible power.

Prior taps distributed RF signals typically carrying video and voice data from a central location, called a headend to a plurality of subscribers. Typically these taps have frequency ranges of zero to 550 MHz. These taps have an input terminal that receives signals from the headend, and an output terminal where these received signals are distributed downstream to other taps. Upgrading of the taps to support higher frequencies, requires removal and replacement of the circuit inside. Removing the tap circuit temporarily disconnects service downstream. When supplying video, a short temporary disconnects of service was tolerated by the subscribers. However, taps now send and receive telephony signals in which a temporary disconnection in service is unacceptable.

SUMMARY OF THE INVENTION

An object of this invention is to provide an improved method and apparatus for distributing RF signals carrying voice, data or video information to a subscriber.

It is also object of this invention is to upgrade existing passives with a circuit which splits RF signals and routes these split signals to connectors on a face plate for distribution to a subscriber without interruption of downstream service.

Another object of this invention is to connect a power distribution unit to an existing tap such that the tap can be upgraded without interrupting service downstream.

These and other objects of the invention are provided with a system for distributing multimedia information from a headend unit to a subscriber. The system has a network media operative to distribute an RF signal and a tap. The RF signal contains multimedia information originating from the headend. Included with the tap is an input terminal coupled to the network media to which the RF signal is fed. The tap has an output terminal for feeding the RF signal downstream to the subscriber, and a plurality of RF output connectors. Mounted on the tap is a front supporting an RF circuit that is removable engagable with the input terminal The circuit distributes the RF signal on the input terminal to the output connectors, and the circuit contains a switch that electrically shorts said input terminal to said output terminal when the circuit is disengaged from the input terminal. The switch removes the electrical short between the input terminal and the output terminal when the circuit is engaged with the input terminal thereby preventing a downstream interruption of service.

In another aspect of the invention a method of servicing a tap is provided. The tap has an input terminal, an output terminal, a plurality of RF connectors, and an RF circuit on a front portion of the tap for distributing an RF signal on the input terminals to the RF connectors. When servicing the tap, the front portion of the tap is removed. As the front portion is removed for servicing, a switch is engaged to connect the input terminal to the output terminal. Engaging the switch maintains an electrical connection there between. The switch replaces the RF circuit to prevent disconnection downstream. When reattaching the front portion to the tap after servicing or upgrading, the circuit makes electrical contact with the input output terminals, disengages the switch and effectively removes the switch from the RF circuit.

The foregoing and other objects of the present invention a well as the invention itself, may be more fully understood from the following description when read together with the accompanying drawings.

BRIEF DESCRIPTION OF THE DRAWINGS

FIG. 1 is block diagram of a system for distributing video and telephony signals from a headend unit to a subscriber home in accordance with the invention;

FIG. 2 is schematic diagram of the passive unit shown in FIG. 1;

FIGS. 3A and 3B are perspective views of a non-interruptible circuit illustrating the principles of the invention;

FIG. 4 is an exploded view of a preferred embodiment of the passive unit;

FIG. 5 is a perspective view of a retainer shown in FIGS. 3A, 3B and 4;

FIG. 7 is a front view of the rear panel of the passive unit shown in FIG. 4.

DETAILED DESCRIPTION OF THE PREFERRED EMBODIMENT

Figure 6:
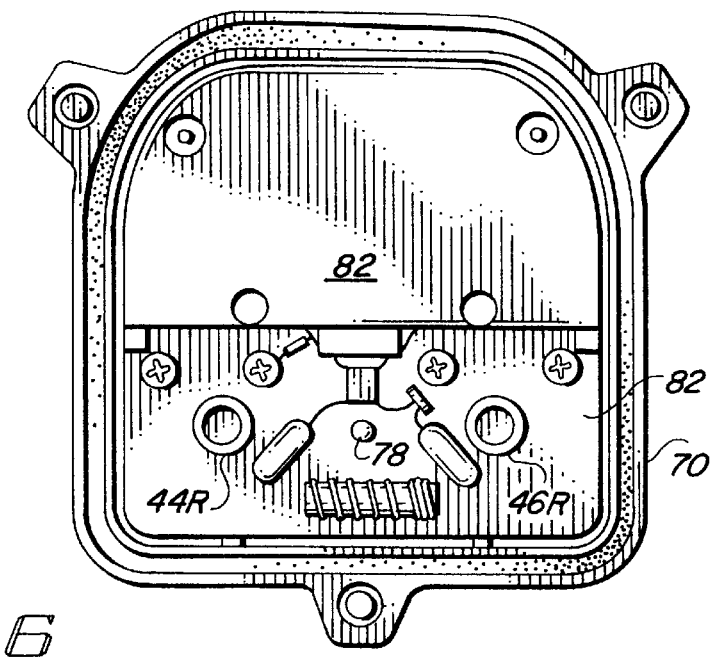
FIG. 6 is rear view of the front panel of the passive unit shown in FIG. 4.

Referring to FIG. 1, there is shown a system 10 for distributing data, sound, and video, generally referred to as multimedia information, from a headend unit 12 to subscribers 14. The headend 12 typically receives RF signals carrying the multimedia information from a satellite, cable, fiber optic networks, microwave, VHF, UHF, or other sources and transmits these signals to a subscriber home 14 via distribution network 16. Distribution network 16 includes a Hybrid Fiber or Coax network, amplifiers 18 and other distribution equipment that connect headend unit 12 with a passive, hereafter referred to as taps 20–20N.

An example tap 20, shown in more detail in FIG. 2, receives an RF signal from network 16 on upstream line 25. The RF signal is received on input port or terminal 50. The RF signal exits tap 20 at output terminal 52. Tap 20 feeds the RF onto downstream line 27 to other devices downstream of the network 18. Tap 20 splits the composite signal into a plurality of RF signals.

The split RF signals exits standard F-type connectors or terminals 30–36, typically located on a front panel assembly 70 (FIG. 4) of tap 20. These split RF signals are respectively fed to a customer interface unit (CIU) (not shown) using a coaxial cable. The CIU is typically located on the side of home 14. These split RF signals may be fed directly to a subscriber set top terminal or other subscriber home communications device. The RF signal is fed to tap 20 over a network coaxial cable 25. Upon exiting tap 20 on terminal 52, the RF signal is fed to network coaxial cable 27.

Referring to FIG. 2, there is shown a simplified schematic diagram of a tap 20 having an input terminal 50 and an output terminal 52. Tap 20 has rear panel assembly 68 and a front panel assembly 70 (FIG. 4) which contains an RF circuit 58. RF circuit 58 contains receptacles 44R and 46R that mate with plugs 54P and 56P respectively on assembly 68. Tap 20 includes switch 42 electrically coupled in parallel with circuit 58 between terminals 50 and 52. Switch 42 opens when front panel assembly 70 engages with rear panel assembly 68 and receptacles 44R and 46R engage with plugs 54P and 56P respectively. Switch 42 closes when front panel assembly 70 is removed from rear panel assembly 68 and receptacles 44R and 46R disengage from plugs 54P and 56P respectively. The RF signal on input terminal 50 is fed through plugs 54P and receptacle 44R to circuit 58. RF signals exit circuit 58 though receptacle 46R and plug 56P to terminal 52.

Switch 42 contains terminals 54 and 56, and plate 60. Plate 60 through mechanical means, as will be described later in FIGS. 3 and 4, disengages from terminals 54 and 56 to open switch 42. Plate 60 engages with terminals 54 and 56 to close switch 42.

Circuit 58 contains a choke 62 with an input terminal 63 and an output terminal 65 respectively connected to receptacles 44R and 46R. Choke 62 is coupled at terminal 63 through capacitor 68 and coupled at its other terminal 65 through capacitor 70 to coupler circuit 64. Coupler circuitry 64 is coupled through splitter circuitry 66 to output terminals 30–36. Details of this schematic are described in pending U.S. application Ser. No. 08/297,724 (now U.S. Pat. No. 5,483,208) filed Aug. 26, 1994, which is hereby incorporated by reference.

Referring to FIGS. 3A and 3B there is shown a diagram illustrating the principles of the invention. Tap 20 (FIG. 4) contains a plate 60 that extends between terminal 54 and 56. Plate 60 is elongated, thin, flat and constructed from a metal material and curved at its ends 60A and 60B. Plate 60 rests on a top terminal support 72 that surrounds terminals 54 and 56 to provide support therefor. When front panel 70 disengages (disconnects) from rear panel 68, plate 60 engages with terminals 54 and 56 to electrically short the terminals together. Concurrently with front panel 70 being disengaged, receptacles 44R and 46R are electrically and physically disengaged from the top end of terminals or plugs 54P and 56P, as shown in FIG. 3A.

Resting on plate 60 is a retainer 74. Front panel assembly 70 contains a protrusion 78, which engages with retainer 74, when front panel assembly 70 is engaged with rear panel 68. Upon engaging front panel 70 with rear panel assembly 68, receptacles 44R and 46R engage with plugs 54P and 56P respectively to make electrical contact therewith. Simultaneously protrusion 78 forces retainer 74 to slide down into an aperture 80 (FIG. 4) in top terminal support 72. As retainer 74 slides downward, plate 60 is forced into aperture resulting in the ends of plate 60A and 60B electrically and physically disconnecting from terminals 54 and 56.

When front panel 70 again disengages from rear panel assembly 68, plate 60 springs upward to engage with terminals 54 and 56 to electrically short the terminals together. Throughout the removal an electrical connection is maintained between terminals 54 and 56 preventing interruption of service to subscribers downstream.

Figure 8:
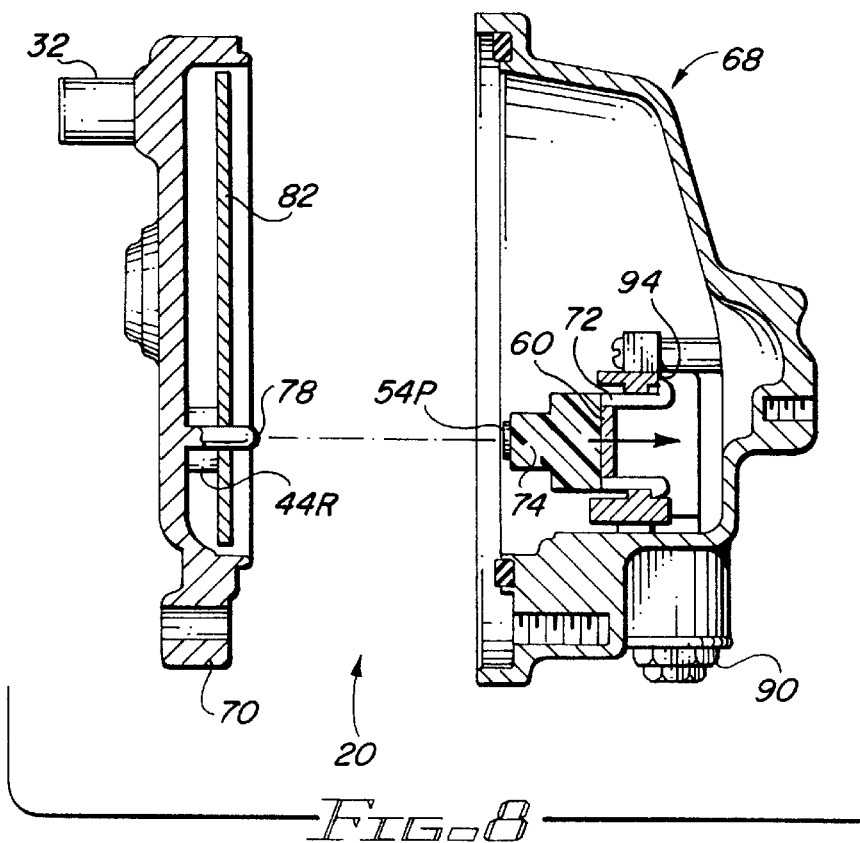
FIG. 8 is an exploded side view of the passive unit cut along line 8—8 in FIG. 7 with a side view of the front panel shown in FIG. 6.

Referring to FIGS. 4, 7 and 8 there is shown a conventional tap 20 having a front panel assembly 70 and a rear panel assembly 68.

Referring to FIGS. 6 and 8, mounted on front panel assembly 70 is an RF circuit board 82 containing circuit 58. Extending away from front panel assembly 70 is elongated protrusion 78. Mounted on the surface of circuit board 82 and extending perpendicularly from it are cylindrically shaped receptacles 44R and 46R. Receptacles 44R and 46R have a spring type inner surface to engage with the top of terminals 54P and 56P.

Referring to FIGS. 4, 7 and 8, rear panel assembly 68 has ports 86, 88, 90 and 92 though which line 25 and 27 are adapted to extend therethrough to connect to terminals 54 and 56 respectively. Terminals 54 and 56 are supported by top terminal support 72 and bottom terminal support 94. Terminals 54 and 56 rotate about their longitudinal axis 96 and 98 respectively to connect through lines 25 and 27 entering tap 20 though ports 86 and 88, or ports 90 or 92. Terminals 54 and 56 have an aperture (not shown) extending through their bottom portion to receive lines 25 and 27. A screw (not shown) is also embedded into terminals 54 and 56 to hold lines 25 and 27 in the aperture.

Referring to FIG. 4, top terminal support 72 engages with bottom terminal support 94 to hold terminals 54 and 56 therebetween. Supports 72 and 94 connect to rear panel assembly 68 with screws 100 and 102. Top terminal support 72 has an aperture 106 and 108 though which terminals 54 and 56 extend therethrough. Support 72 has a center aperture 80 (FIG. 4) that receives retainer 74. Elongated rectangular plate 60 rests on support 72 and is held in place with retainer 74.

Referring to FIG. 5, retainer 74 has a top engaging surface 110 and four legs 112–118 extend downward therefrom. At the bottom of each leg 112-118 are lips 120–126 respectively which engage with a back surface of support 72. Legs 112–118 flex inwardly toward each other when engaging with support 72, and then flex outwardly after engagement. The bottom of surface 110 slopes inward and downward to a point 132 to urge plate 60 into aperture 80.

It is preferable that assemblies 68 and 70 are constructed from a nonmagnetic metal material. Assemblies 68 and 70 have a plastic or rubber type gasket material, as is known in the art, attached to their surfaces where the assemblies contact each other to prevent water leakage. It also preferable that an EMI gasket material is positioned adjacent the gasket material to prevent RFI leakage.

While the principles of the invention have been made clear in the illustrated embodiments, there will be immediately obvious to those skilled in the art, many modifications are structured arrangements proportions, elements, materials, and components used in the practice of the invention, in otherwise which are particularly adapted for specific environments and operational requirements, without departing from those principles. The appended claims are therefore intended to cover and embrace any such modifications within the limits only of the true spirit and scope of the invention.

What we claim are:

1. A tap for distributing an RF signal onto a network media to subscribers, the tap comprising:
    an input terminal coupled to said network media to which said RF signal is fed;
    an output terminal through which the RF signal is passed;
    a plurality of RF output connectors;
    a circuit, removably engagable with said input and output terminal, operative to distribute the RF signal on the input terminal to the output connectors, wherein the circuit has a pair of members that engage with the input and output terminals as the circuit engages with the input and output terminals; and
    a switch means for ensuring an electrical connection is maintained between said input terminal and said output terminal while said circuit is disengaged from said terminals to prevent the interruption of signals to subscribers by electrically short circuiting said input terminal to said output terminal before said circuit is disengaged from said input terminal, and for removing the electrical short circuit between said input terminal and said output terminal when said circuit is engaged with said input terminal.

2. The tap as recited in claim 1 wherein said terminals having a longitudinal axis extending therethrough and said terminals are rotatable about the longitudinal axis.

3. A tap for distributing an RF onto a network media to subscribers, the tap comprising:
    an input terminal coupled to said network media to which said RF signal is fed;
    an output terminal through which the RF signal is passed;
    a plurality of RF output connectors;
    a circuit, removably engagable with said input and output terminal, operative to distribute the RF signal on the input terminal to the output connectors;
    a switch means for ensuring an electrical connection is maintained between said input terminal and said output terminal while said circuit is disengaged from said terminals to prevent the interruption of signals to subscribers by electrically short circuiting said input terminal to said output terminal before said circuit is disengaged from said input terminal, and for removing the electrical short circuit between said input terminal and said output terminal when said circuit is engaged with said input terminal, wherein said switch means includes a flexible electrically conductive plate extending between said input and output terminal operative to physically contact said input and output terminals when said circuit is disengaged from said input terminal and to disengage from said input terminal when said circuit is engaged with said input terminal;
    a support disposed between said input and output terminal for holding said plate; and
    a member slidably engagable with said plate when said circuit is disengaged from said input terminal, said member operative to depress a section of said plate to disconnect said plate from said input terminal when said circuit is engaged with said input terminal.

4. A tap for distributing power and radio frequency (RF) signals from a cable comprising:
    a first terminal operative to couple to the cable through which the RF signals are fed;
    a second terminal through which the RF signals are fed to a second cable;
    said terminals having a longitudinal axis extending therethrough and said first and second terminals being rotatable about the longitudinal axis;
    a plurality of RF output connectors;
    a circuit removably engagable with said first terminal;
    said circuit, when engaged with the first terminal, being operative to split the RF and power signal on the first terminal and to feed the split RF signal to the RF output connectors, and being operative to feed the RF and power signal on the first terminal to the second terminal; and
    a plate for engaging with said first terminal to electrically short said first terminal to said second terminal when said circuit is disengaged from said first terminal, and for disengaging from said first terminal to remove said electrical short between said first terminal and said second terminal when said circuit is engaged with said first terminal;
    a rear panel holding said first terminal and said second terminal; and
    a front panel attached to said circuit and supporting said RF output connectors.

5. The tap as recited in claim 4 further comprising:
    a support member substantially extending between said input and output terminal and holding said plate; and
    a slidable member in contact with said support member and having a surface to depress said plate when said front panel is connected to said rear panel.

6. The tap as recited in claim 5 wherein said support member has a top engaging surface to hold said plate between said terminals.

7. The tap as recited in claim 6 wherein said support member is shaped to permit said plate to flex when said slidable member depresses said plate and disengage from said input terminal.

8. A method for distributing RF signals on a network media using a tap, the method comprising the steps of:
    providing a rear panel having a first pair of ports, a second pair of ports, and an input terminal and an output terminal, each terminal being rotatable about a longitudinal axis extending therethrough;
    extending the network media through the first ports or the second ports;
    rotating the input terminal and the output terminal about their longitudinal axis to hold the extended network media in electrical contact therewith;
    providing a front panel having a plurality of RF output connectors;

attaching to the front panel a circuit having a pair of members operative to mate with the input and output terminal;

providing an electrical short circuit between the input terminal and the output terminal;

assembling the tap by attaching the rear panel to the front panel and by engaging the members with the input terminal and the output terminal to electrically connect the circuit to the network media;

splitting RF signals on the input terminal with the circuit on the assembled tap and transmitting the split RF signals to the RF output connectors; and removing the electrical short circuit when the members electrically connect the circuit to the input terminal and the output terminal.

* * * * *